United States Patent
Uchiyama

(10) Patent No.: US 6,775,149 B1
(45) Date of Patent: Aug. 10, 2004

(54) MULTICHIP MOUNTED STRUCTURE, ELECTRO-OPTICAL APPARATUS, AND ELECTRONIC APPARATUS

(75) Inventor: Kenji Uchiyama, Hotaka-machi (JP)

(73) Assignee: Seiko Epson Corporation (JP)

( * ) Notice: Subject to any disclaimer, the term of this patent is extended or adjusted under 35 U.S.C. 154(b) by 92 days.

(21) Appl. No.: 09/585,154

(22) Filed: Jun. 1, 2000

(30) Foreign Application Priority Data

Jun. 2, 1999 (JP) ............................................ 11-155234

(51) Int. Cl.⁷ ............................ H05K 7/02; H05K 7/06; H05K 7/08; H05K 7/10
(52) U.S. Cl. ...................... 361/760; 361/761; 361/764; 361/736; 361/749; 361/803; 361/735; 361/748; 361/790
(58) Field of Search ................................. 361/760, 761, 361/764, 736, 749, 813, 735, 790, 803, 748; 385/2, 8, 14

(56) References Cited

U.S. PATENT DOCUMENTS

| | | | | |
|---|---|---|---|---|
| 4,767,170 A | * | 8/1988 | Mizutani et al. | 385/129 |
| 4,927,230 A | * | 5/1990 | Tokumitsu | 385/17 |
| 5,289,345 A | * | 2/1994 | Corradetti et al. | 361/752 |
| 5,606,440 A | * | 2/1997 | Kawaguchi et al. | 349/188 |
| 5,737,272 A | * | 4/1998 | Uchiyama et al. | 345/206 |
| 5,777,610 A | * | 7/1998 | Sugimoto et al. | 345/206 |
| 5,847,796 A | | 12/1998 | Uchiyama et al. | |
| 6,133,978 A | * | 10/2000 | Tajima | 349/150 |
| 6,158,115 A | | 12/2000 | Tsukagoshi et al. | |

FOREIGN PATENT DOCUMENTS

| | | |
|---|---|---|
| CN | 1160223 A | 9/1997 |
| CN | 1174490 A | 2/1998 |
| JP | 62-90953 | 4/1987 |
| JP | 4-87359 | 3/1992 |
| JP | 05-152381 | 6/1993 |
| JP | 08 172111 | 7/1996 |
| JP | 08-304845 | 11/1996 |
| JP | 09-044100 | 2/1997 |

OTHER PUBLICATIONS

Communication from Chinese Patent Office re: counterpart application.
Communication from Japanese Patent Office regarding counterpart application.
Japanese Notice of Preliminary Rejection.
Examination report regarding China Patent Appln. No. JP 00108797.5 dated Jan. 17, 2003.

\* cited by examiner

Primary Examiner—Kamand Cuneo
Assistant Examiner—Thanh Y. Tran
(74) Attorney, Agent, or Firm—Harness, Dickey & Pierce, P.L.C.

(57) ABSTRACT

A multichip mounted structure has a substrate 11 provided with substrate-side terminals 16a and 16b and a plurality of IC chips 12a and 12b provided with bumps 14a and 14b, respectively, so that the substrate-side terminals 16a and 16b are conductively connected with the bumps 14a and 14b, respectively. The bumps 14a and 14b provided on the plurality of IC chips 12a and 12b, respectively, form pairs of terminal lines opposing each other. Since the plurality of IC chips 12a and 12b are mounted on the substrate 11 so that central lines L1 and L2 between the pairs of terminal lines which are individually formed approximately coincide with each other, it is not necessary to transport a position of a compressive head, and one piece of ACF 19 can be commonly used.

22 Claims, 9 Drawing Sheets

MULTICHIP MOUNTED STRUCTURE, ELECTRO-OPTICAL APPARATUS, AND ELECTRONIC APPARATUS

BACKGROUND OF THE INVENTION

1. Industrial Field of the Invention

The present invention relates to a multichip mounted structure in which a plurality of integrated circuit (IC) chips are mounted on a substrate. In addition, the present invention relates to an electro-optical device in which an electro-optical material, such as liquid crystal, encapsulated between a pair of substrates is controlled so as to display characters, numerals, pictures, and the like. Furthermore, the present invention relates to an electronic apparatus composed of the electro-optical device.

2. Description of the Related Art

Currently, in electronic apparatuses such as mobile phones and mobile information terminals, liquid crystal devices using liquid crystal as an electro-optical material are widely used for electro-optical devices as display means. In many cases, the liquid crystal devices are used for displaying characters, numerals, pictures, and the like.

In the liquid crystal devices, in general, pixels are formed by crossing scanning electrodes formed on one substrate and data electrodes formed on the other substrate at a plurality of points in the form of a dot matrix. Light passing through liquid crystal in a pixel is modulated by selectively changing a voltage applied to the pixel, and thus, images, such as characters, are displayed. In addition to or instead of pixels in the form of a dot matrix, patterned electrodes for optional numerals, pictures, or the like may be formed on each substrate in some cases.

In these liquid crystal devices, in general, light passing through a selected pixel is modulated by applying a scanning voltage on the scanning electrodes by a liquid crystal driver IC and by applying a data voltage on the data electrodes, and thus, characters, numerals, or the like are displayed at the outside of one of the substrates.

There have been various known methods for connecting a liquid crystal driver IC, i.e., an IC chip, to a liquid crystal device. For example, a so-called COF (chip on FPC (flexible printed circuit)) method is known, in which IC chips are mounted on a relatively thin flexible printed circuit having flexibility, and then the printed circuit provided with the IC chips thereon is connected to a substrate which is an element for constructing a liquid crystal device. In addition, a so-called COG (chip on glass) method is known, in which IC chips are directly mounted on a substrate which constructs a liquid crystal device.

In liquid crystal devices and other devices using ICs, a plurality of IC chips are used when necessary, and in this case, a multichip mounted structure, i.e., a structure having a plurality of IC chips mounted on a substrate, is employed. In a conventional multichip mounted structure, a plurality of IC chips are disposed without having any positional relationship therebetween.

Various tools are used when IC chips are mounted on a substrate. For example, when IC chips are mounted on a substrate using a bonding agent, such as an ACF (anisotropic conductive film), the IC chips are heated and compressed on the substrate with the ACF or the like therebetween. That is, a compressive head is used as a tool for heating and compressing.

When the compressive head is used for manufacturing a multichip mounted structure, and when IC chips are disposed without having any positional relationship therebetween, as can be seen in a conventional multichip mounted structure, the compressive head must be moved in a complicated manner corresponding to locations at which the IC chips are disposed. As a result, there is a problem in that the configuration of the manufacturing apparatus having a compressive head is very complicated.

In addition, when IC chips are mounted using a bonding agent, such as the ACF, and when IC chips are disposed without having any positional relationship therebetween, the ACF or the like must be provided on a substrate so as to correspond to individual IC chips. Hence, there is a problem in that workability is very poor.

SUMMARY OF THE INVENTION

Taking the problems described above into consideration, an object of the present invention is that a plurality of IC chips are effectively mounted with high productivity and by a smaller number of manufacturing devices.

(1) To these ends, a multichip mounted structure of the present invention comprises a substrate provided with substrate-side terminals and a plurality of integrated circuit (IC) chips mounted on the substrate, each IC chip having IC-side terminals, in which the substrate-side terminals and the IC-side terminals are in conductive connection with each other, wherein the IC-side terminals formed on the plurality of IC chips form a pair of terminal lines opposing each other, and the plurality of IC chips are mounted on the substrate so that individual central lines between the pairs of terminal lines coincide with each other.

According to the configuration of the multichip mounted structure described above, the plurality of IC chips are mounted on the substrate so that individual central lines between the pairs of terminal lines of the plurality of IC chips approximately coincide with each other. Consequently, when a manufacturing tool, such as a compressive head, is disposed at a predetermined position, a material to be processed, such as a substrate, is linearly transported to the tool and a multichip mounted structure is manufactured by processing the material using the tool, the manufacturing tool is not required to be transported between the plurality of IC chips.

Next, as a method for mounting IC chips on a substrate, for example, methods of using a conductive bonding agent and a non-conductive bonding agent are known. As a conductive bonding agent, there are an ACF (anisotropic conductive film), an ACA (anisotropic conductive adhesive), an isotropic conductive paste, and the like.

The ACF is a conductive polymer film used for electrical and simultaneous connection between pairs of terminals provided with an anisotropic property. For example, the ACF is a film formed by dispersing a number of conductive particles in a thermoplastic or a thermosetting resinous film. By using the ACF, mechanical bonding between materials to be bonded together can be achieved by the resinous film, and electrical conduction between terminals of the materials to be bonded together can be achieved by the conductive particles.

The ACA is a conductive paste used for electrical and simultaneous connection between pairs of terminals provided with an anisotropic property. For example, the ACA is formed by dispersing a number of conductive particles in a bonding paste. By using the ACA, mechanical bonding between materials to be bonded together can be achieved by the paste, and electrical conduction between terminals of the materials to be bonded together can be achieved by the conductive particles.

As an isotropic conductive paste, there is, for example, a silver paste. When the isotropic conductive paste is used, electrical conduction between a plurality of pairs of terminals to be connected can be achieved by interposing the conductive paste between individual pairs of terminals.

As a non-conductive bonding agent, there are an epoxide bonding agent, an acrylic bonding agent, an urethane bonding agent, and the like. When the non-conductive bonding agent is used, mechanical bonding between materials to be bonded together can be achieved by the bonding agent, and electrical conduction between terminals of the materials to be bonded together can be achieved by direct contact between the terminals.

In the case in which one of various methods described above for conductive bonding or another optional method therefor is employed, when a plurality of IC chips are mounted without any positional relationship therebetween on a substrate as those in a conventional multichip mounted structure, bonding agents must be provided on the substrate corresponding to individual IC chips mounted thereon, and hence, workability is very poor.

In contrast, in the multichip mounted structure of the present invention as described above, when the IC chips are mounted on the substrate so that individual central lines between the pairs of terminal lines of the plurality of IC chips approximately coincide with each other, it is sufficient to simply provide a bonding agent, such as the ACF, linearly along the plurality of IC chips.

As a result, according to the multichip mounted structure of the present invention, a plurality of IC chips can be effectively mounted on a substrate with high productivity and by a smaller number of manufacturing devices.

(2) In the configuration of the multichip mounted structure as described above, at least one of the plurality of IC chips may be formed so that the external width of a surface provided with the pair of terminal lines differs from those of the other IC chips. This configuration can be formed, for example as shown in FIG. 1, using a plurality of IC chips 12$a$ and IC chips 12$b$.

(3)

In the configuration of the multichip mounted structure as described above, at least one of the plurality of IC chips may be formed so that the central line between the pair of terminal lines thereof deviates from the external central line of a surface provided with the pair of terminal lines. This configuration can be achieved, for example as shown in FIG. 9, in the case in which a plurality of IC chips 12$c$ and 12$b$ are mounted on a substrate 11, the external central line L0 of the IC chip 12$c$ is not coincident with the central line L2 between the pair of terminal lines of the IC chip 12$b$, and the central line L1 between the pair of terminal lines of the IC chip 12$c$ is approximately coincident with the central line L2 between the pair of terminal lines of the IC chip 12$b$.

(4) In the configuration of the multichip mounted structure as described above, the substrate may be formed by a resinous material having flexibility. This configuration corresponds to a so-called COF (chip on FPC).

(5) In the configuration of the multichip mounted structure as described above, the substrate may be formed by a relatively rigid material having no flexibility, such as an epoxy substrate. This configuration corresponds to a so-called COB (chip on board).

(6) Next, an electro-optical device of the present invention comprises a pair of substrates opposing each other, an electro-optical material being encapsulated between the pair of substrates, and a multichip mounted structure in contact with at least one of the pair of substrates, in which the multichip structure is at least one of a multichip mounted structure according to one of the above (1) to (5).

According to the electro-optical device described above, a plurality of IC chips are mounted on the substrate so that individual center lines between the pairs of terminal lines of the plurality of IC chips approximately coincide with each other. Consequently, the first advantage is that a manufacturing tool is not required to be transported between the plurality of IC chips, when the manufacturing tool, such as a compressive head, is disposed at a predetermined position, a material to be processed, such as a liquid crystal panel, is linearly transported to the tool, and an electro-optical device is manufactured by processing the material using the tool. The second advantage is that a bonding agent, such as the ACF, for bonding IC chips is simply provided linearly along the plurality of IC chips.

As a result, according to the electro-optical device of the present invention, a plurality of IC chips can be effectively mounted on a substrate with high productivity and by a smaller number of manufacturing devices.

In the electro-optical device according to the above (6), liquid crystal may be used as the electro-optical material.

(8) Next, another electro-optical device of the present invention comprises a pair of substrates opposing each other, in which at least one of the pair of substrates is provided with substrate-side terminals, an electro-optical material being encapsulated between the pair of substrates, and a plurality of IC chips, each chip being provided with the IC-side terminals, in which the plurality of IC chips are mounted on at least one of the pair of substrates so that the substrate-side terminals and the IC-side terminals are in conductive connection with each other to form a multichip mounted structure, wherein the multichip mounted structure is at least a multichip mounted structure according to one of the above (1) to (3).

In the electro-optical device described in the above (6), the substrate constructing the electro-optical device and the substrate constructing the multichip mounted structure are different from each other. In contrast, in the electro-optical device described in the above (8), the substrate constructing the electro-optical device is the substrate constructing the multichip mounted structure. On this point, the electro-optical device described in the above (8) differs from that described in the above (6).

(9) In the electro-optical device described in the above (8), liquid crystal may also be used as the electro-optical material.

(10) Next, an electronic apparatus of the present invention comprises an electro-optical device and a housing containing the electro-optical device therein, in which the electro-optical device is composed of at least an electro-optical device according to one of the above (6) to (9). As the electronic apparatuses described above, there are, for example, mobile phones and mobile information terminals.

DETAILED DESCRIPTION OF THE PREFERRED EMBODIMENTS

Embodiments of a multichip mounted structure, an electro-optical device, and an electronic apparatus according to the present invention will be described with the accompanying drawings, by using a liquid crystal driver integrated circuit (IC) as an example of an IC chip, and by using a liquid crystal device which employs liquid crystal as an electro-optical material as an example of the electro-optical device.

Figure 1:
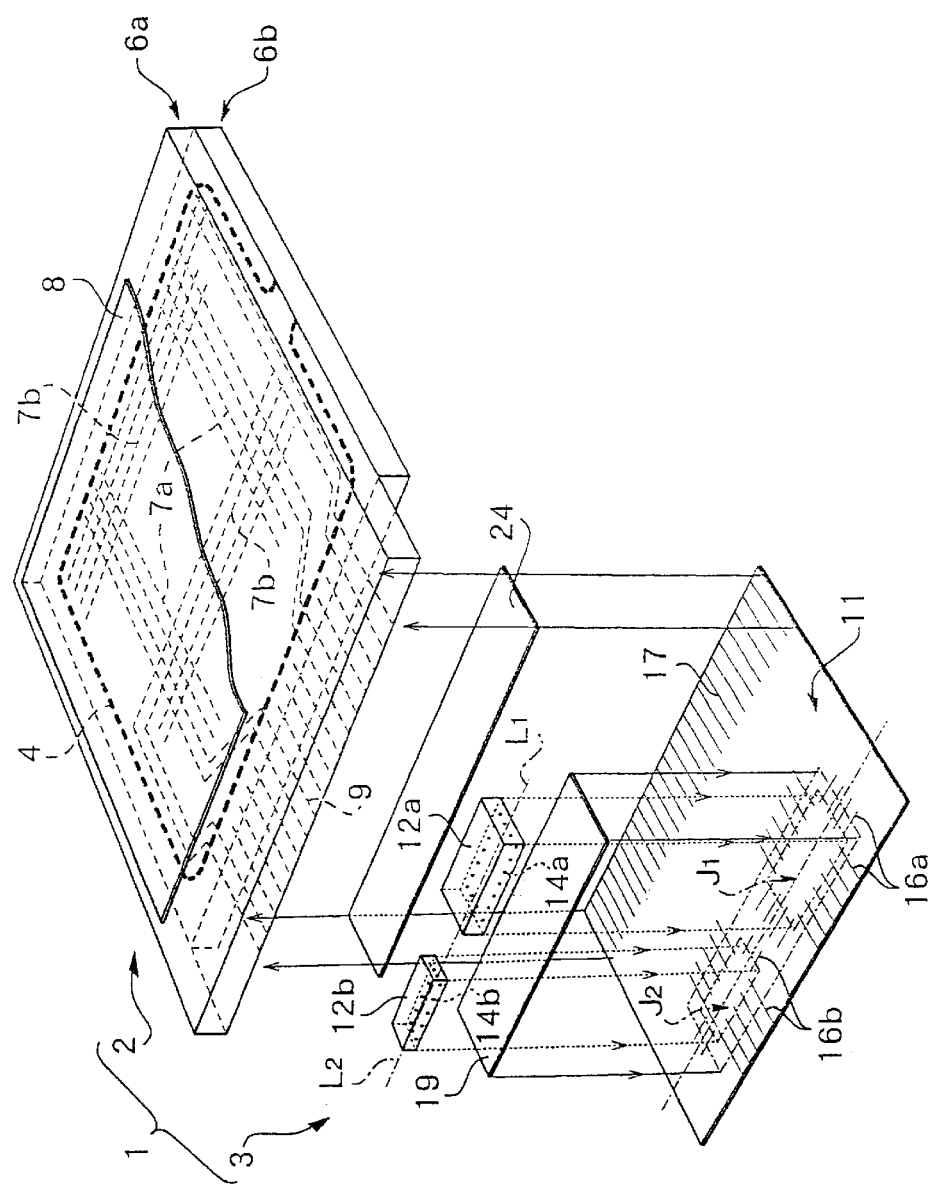
FIG. 1 is a perspective view showing an embodiment of a multichip mounted structure of the present invention and a partly exploded liquid crystal device of the present invention.

FIG. 1 shows an embodiment of the multichip mounted structure of the present invention, and shows the liquid crystal device using the multichip mounted structure of an embodiment of the electro-optical device of the present invention. A liquid crystal device 1 shown in the figure is formed by connecting a multichip mounted structure 3 to a liquid crystal panel 2. In addition, when necessary, the liquid crystal device 1 is provided with a light unit (not shown), such as a backlight, and other accessory units (not shown).

The liquid crystal panel 2 is provided with a pair of substrates 6a and 6b which are bonded to each other with a sealing material 4, and liquid crystal is encapsulated in a gap formed between the substrates 6a and 6b, that is, a so-called cell gap. In general, the substrates 6a and 6b are formed of an optical transparent material, such as a glass or a flexible synthetic resin. Polarizers 8 are glued on the outside surfaces of the substrates 6a and 6b.

Electrodes 7a are formed on the inside surface of one of the substrates, i.e., the substrate 6a, and electrodes 7b are formed on the inside surface of the other substrate 6b. In the embodiment in FIG. 1, the electrodes 7a and 7b are formed in the form of stripes; however, they may be formed in other patterns, such as characters, numerals, and pictures. The electrodes 7a and 7b are formed of an optical transparent material, such as ITO (indium tin oxide).

The substrate 6a has a protruding portion protruding over the other substrate 6b, and a plurality of terminals, that is, a plurality of external connection terminals 9 are formed on the protruding portion. These external connection terminals 9 are simultaneously formed when the electrodes 7a are formed on the substrate 6a, and hence, the external connection terminals 9 are formed of, for example, ITO. The external connection terminals 9 include terminals integrally extending from the electrodes 7a and terminals in contact with the electrodes 7b via an electrically conductive material (not shown). The electrically conductive material is, for example, included in the sealing material 4 in a dispersed state.

Actually, the electrodes 7a and 7b and the terminals 9 are, respectively, composed of a number of electrodes and terminals which are formed with extremely minute spaces therebetween on the substrates 6a and 6b; however, for ease of illustration in FIG. 1, the respective spaces of the electrodes and the terminals are enlarged and schematically drawn, and in addition, several electrodes 7a and 7b and the terminals 9 are representatively shown in the figure, and others are omitted.

The multichip mounted structure 3 is formed by mounting a plurality of liquid crystal driver ICs 12a and 12b as IC chips on predetermined positions of a wiring substrate 11 as a substrate. The mounting mentioned above is a bonding state which can simultaneously achieve two effects, that is, the liquid crystal driver ICs 12a and 12b are mechanically and tightly brought into contact with the wiring substrate 11, and terminals of the liquid crystal driver ICs 12a and 12b are brought into conductive contact with corresponding terminals of the wiring substrate 11.

Figure 2:
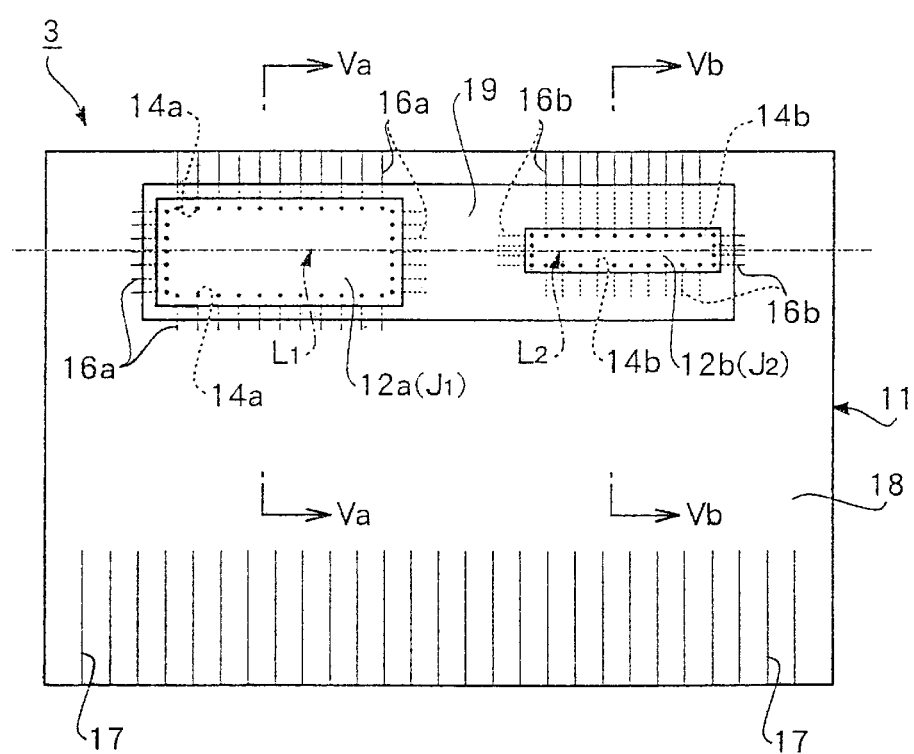
FIG. 2 is a plan view of a portion of the multichip mounted structure in FIG. 1.

The wiring substrate 11, as shown in FIG. 2, is manufactured by forming substrate-side terminals 16a and 16b and liquid-crystal-side connection terminals 17 with Cu (copper) or other metal pattern formed on a surface of a base layer 18.

The base layer 18 is formed of a flexible material, such as a polyimide resin, or a non-flexible and relatively rigid material, such as a glass reinforced epoxy resin. When the base layer 18 is formed of a flexible material, a so-called COF (chip on flexible printed circuit) structure is formed. Conversely, when the base layer 18 is formed of a non-flexible material, a so-called COB (chip on board) structure is formed.

Front ends of the substrate-side terminals 16a and 16b extend, respectively, into an IC mounting area J1 for mounting the liquid crystal driver IC 12a and into an IC mounting area J2 for mounting the liquid crystal driver IC 12b. In the actual wiring substrate 11, the substrate-side terminals 16a and 16b and the liquid-crystal-side connection terminals 17 are connected to each other by an appropriate wiring pattern; however, since the appropriate pattern can be achieved by various kinds of patterns, the pattern is omitted in FIG. 2.

Figure 3:
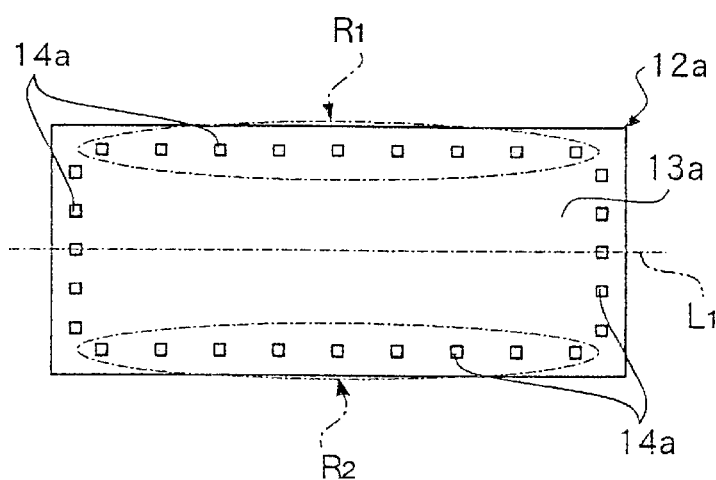
FIG. 3 is a plan view showing an example of IC chips.
Figure 4:
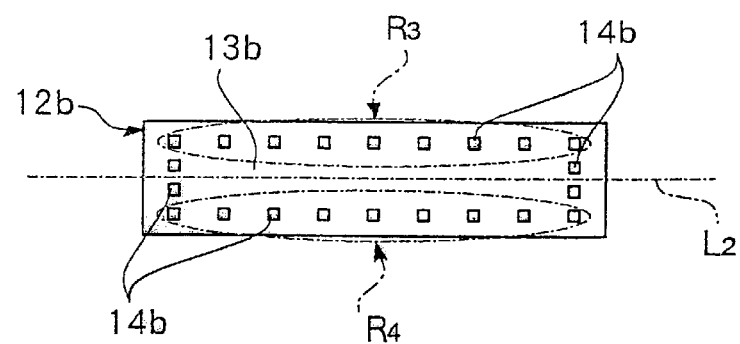
FIG. 4 is plan view showing another example of IC chips.

The liquid crystal driver IC 12a, as shown in FIG. 3, has a plurality of bumps 14a as IC-side terminals on an active surface 13a of the liquid crystal driver IC 12a. In addition, the liquid crystal driver IC 12b, as shown in FIG. 4, has a plurality of bumps 14b as IC-side terminals on an active surface 13b of the liquid crystal driver IC 12b.

When the liquid crystal driver IC 12a and the liquid crystal driver IC 12b are mounted on the wiring substrate 11, as shown in FIG. 1, an ACF (anisotropic conductive film) 19 as a bonding agent is glued on the surface of the wiring substrate 11 so as to cover the IC mounting area J1 and the IC mounting area J2. Next, the liquid crystal driver IC 12a and the liquid crystal driver IC 12b are temporarily disposed on the wiring substrate 11 so that the bumps 14a and 14b of the liquid crystal driver ICs 12a and 12b are placed at positions corresponding to those of the substrate-side terminals 16a and the substrate-side terminals 16b, respectively.

Figure 5:
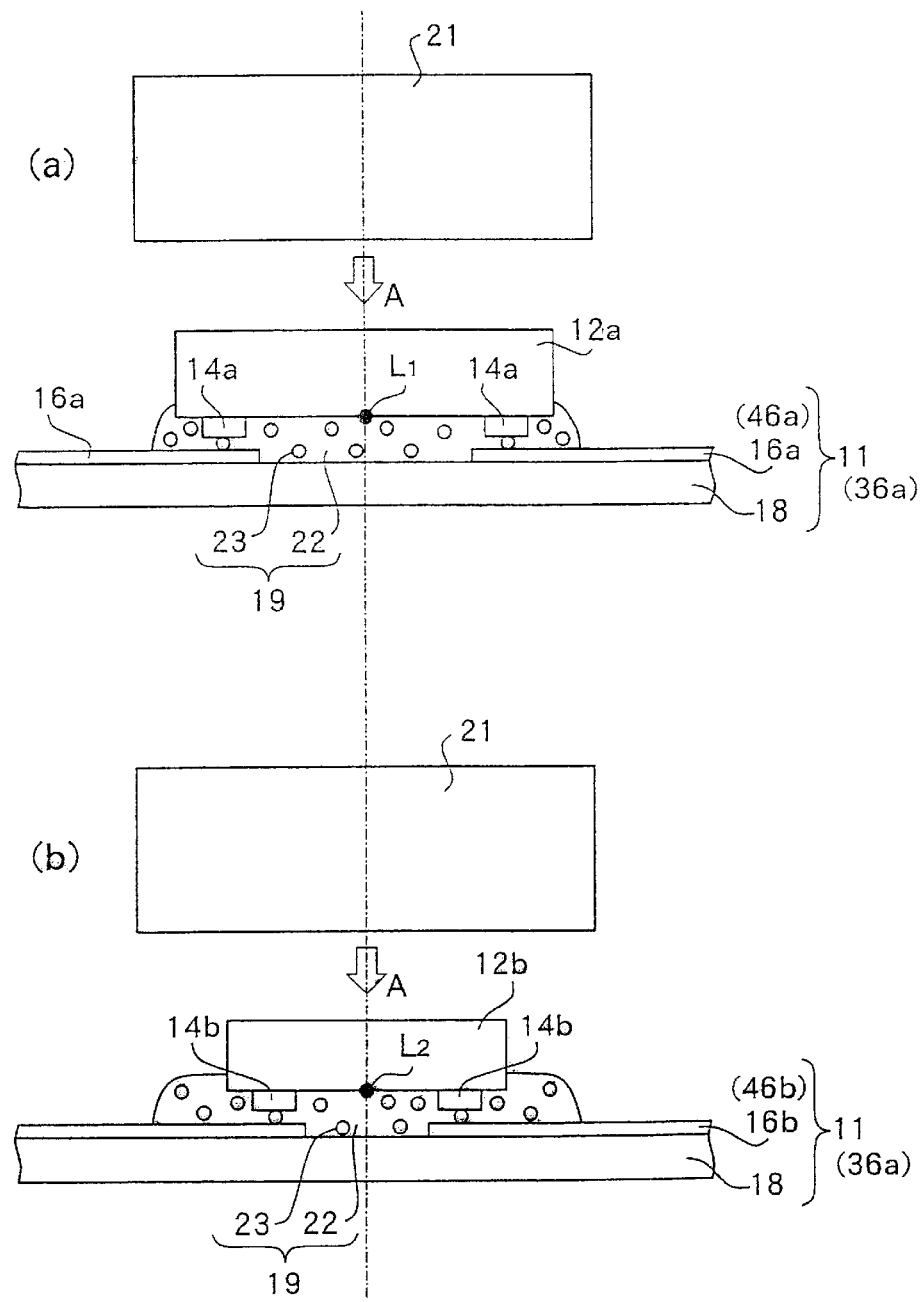
FIGS. 5(a) and (b) schematically show a compression bonding operation.

Then, as shown in FIG. 5(a), the part of the wiring substrate 11 on which the liquid crystal driver IC 12a is temporarily disposed is transported by a transporting apparatus under a compressive head 21 which is heated to a predetermined temperature by a heater, and the liquid crystal driver IC 12a and the ACF 19 are heated and compressed by moving the compressive head 21 in the direction indicated by an arrow A.

By the heating and compression, a resin 22 of the ACF 19 is cured, and the liquid crystal driver IC 12a is tightly bonded to the base layer 18 of the wiring substrate 11. Furthermore, the bumps 14a and the substrate-side terminals 16a are conductively connected to each other via conductive particles 23 in the ACF 19. FIG. 5(a) is a cross-sectional view taken along the line Va—Va in FIG. 2.

Upon completion of the compression bonding of the liquid crystal driver IC 12a as described above, the transporting apparatus of the wiring substrate 11 restarts, and, as shown in FIG. 5(b), the part of the wiring substrate 11 on which the liquid crystal driver IC 12b is temporarily disposed is transported by the transporting apparatus under the compressive head 21, and the liquid crystal driver IC 12b and the ACF 19 are heated and compressed by moving the compressive head 21 in the direction indicated by an arrow A. By this heating and compression, the resin 22 of the ACF 19 is cured, and the liquid crystal driver IC 12b is tightly bonded to the base layer 18 of the wiring substrate 11. Furthermore, the bumps 14b and the substrate-side terminals 16b are conductively connected to each other via the conductive particles 23 in the ACF 19. FIG. 5(b) is a cross-sectional view taken along the line Vb—Vb in FIG. 2.

By the compression bonding as described above, as shown in the plan view in FIG. 2, the liquid crystal driver IC 12a and the liquid crystal driver IC 12b are mounted on the predetermined IC mounting areas J1 and J2, respectively, in the wiring substrate 11. Next, as shown in FIG. 1, the liquid-crystal-side connection terminals 17 of the wiring substrate 11 and the protruding portion of the liquid crystal substrate 6a are heated and compressed with an ACF 24 therebetween, that is, compression bonding is performed, and hence, the multichip mounted structure 3 is connected to the liquid crystal panel 2.

In the embodiment, as shown in FIG. 3, the plurality of bumps 14a provided on the liquid crystal driver IC 12a are disposed so as to form a pair of terminal lines R1 and R2 opposing each other. As shown in FIG. 4, the plurality of the bumps 14b provided on the liquid crystal driver IC 12b are disposed so as to form a pair of terminal lines R3 and R4 opposing each other.

In the embodiment, in the state in which the liquid crystal driver IC 12a and the liquid crystal driver IC 12b are mounted on the wiring substrate 11, a central line L1 (refer to FIG. 3) between the terminal lines R1 and R2 on the liquid crystal driver IC 12a and a central line L2 (refer to FIG. 4) between the terminal lines R3 and R4 on the liquid crystal driver IC 12b are disposed so as to approximately coincide with each other, that is, the substrate-side terminals 16a and 16b are wired in a predetermined pattern so that the central lines Li and L2 are approximately disposed on a straight line.

In the case in which mounting positions for the liquid crystal driver ICs 12a and 12b are defined as described above, when the wiring substrate 11 on which the liquid crystal driver ICs 12a and 12b are temporarily disposed is simply and linearly transported in the direction parallel to the central lines L1 and L2 between the bumps of the individual liquid crystal driver ICs, and when the compressive head 21 is disposed at a predetermined position, the liquid crystal driver ICs 12a and 12b are precisely transported under the compressive head 21. That is, compression bonding can be precisely performed for a plurality of liquid crystal driver ICs without complicated movement of the compressive head 21.

In the embodiment, since the central lines L1 and L2 of the liquid crystal driver ICs 12a and 12b, respectively, are approximately disposed on a straight line, it is sufficient that only a piece of the ACF 19 for bonding the liquid crystal driver ICs 12a and 12b be glued along the central lines L1 and L2. When the positions of the central lines L1 and L2 between the bumps of the liquid crystal driver ICs 12a and 12b, respectively, are deviated from each other, an operation for gluing the ACF on the substrate becomes complicated since a plurality of ACFs are required for individual liquid crystal driver ICs; however, in the embodiment, the complicated operation can be avoided.

In the embodiment, in the liquid crystal driver ICs 12a and 12b, the external width of the IC chip at a surface on which the terminal lines R1 and R2 are formed is different from that of the IC chip at a surface on which the terminal lines R3 and R4 are formed (the liquid crystal driver IC 12a is wider than the liquid crystal driver IC 12b); however, the external widths of the liquid crystal driver ICs 12a and 12b may be equivalent to each other.

Figure 6:
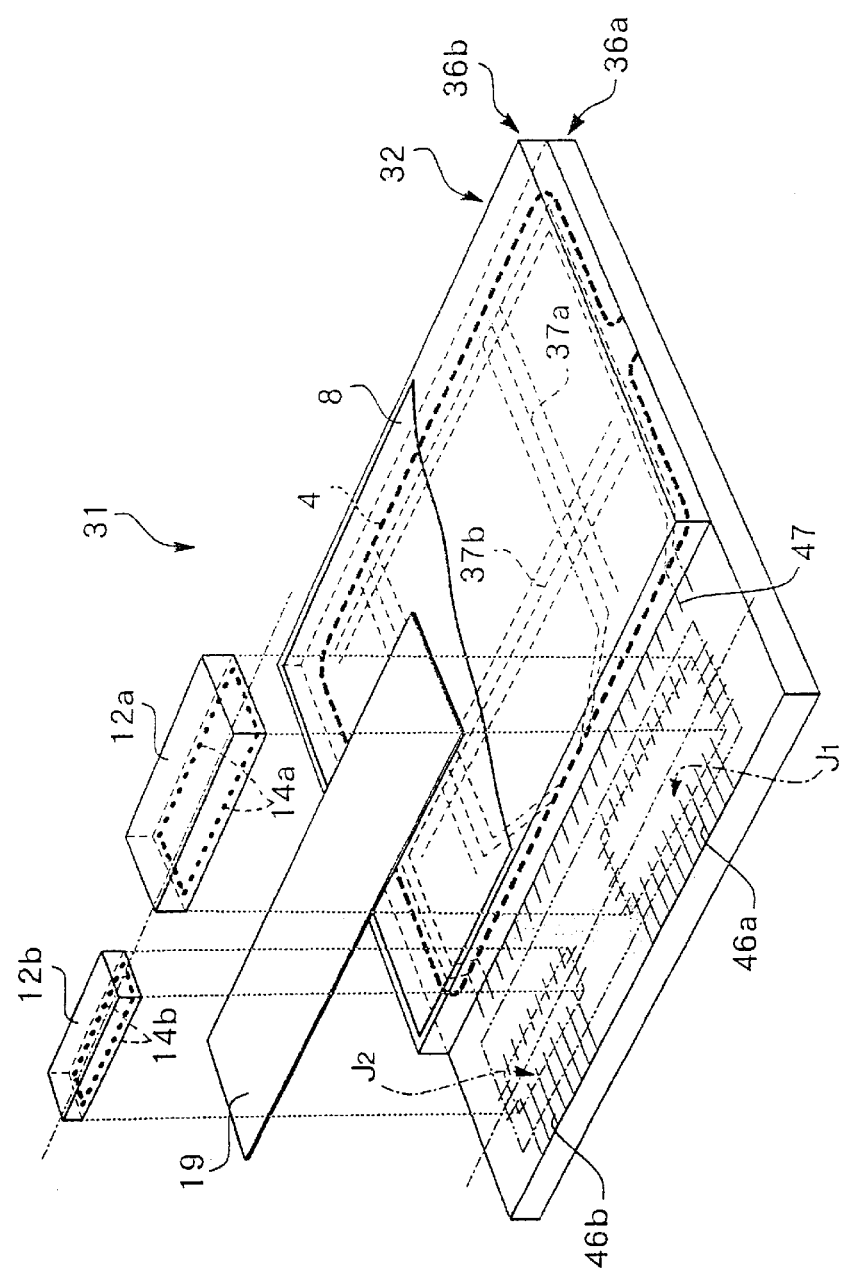
FIG. 6 is a perspective view showing another embodiment of a multichip mounted structure of the present invention and a partly exploded liquid crystal device of the present invention.

FIG. 6 shows another embodiment of a multichip mounted structure of the present invention, and shows a liquid crystal device of another embodiment of an electro-optical device of the present invention. A liquid crystal device 31 is formed by directly mounting a plurality of liquid crystal driver ICs 12a and 12b on a liquid crystal panel 32. That is, the liquid crystal device of the embodiment is a COG type liquid crystal device. In addition, when necessary, the liquid crystal panel 32 is provided with a light unit (not shown), such as a backlight, and accessory units (not shown).

The liquid crystal panel 32 is provided with a pair of substrates 36a and 36b which are bonded to each other by a sealing material 4, and liquid crystal is encapsulated in a gap formed between the substrates 36a and 36b, that is, a so-called cell gap. In general, the substrates 36a and 36b are formed of an optical transparent material, such as a glass or a flexible synthetic resin. Polarizers 8 are glued on the outside surfaces of the substrates 36a and 36b.

Electrodes 37a are formed on the inside surface of one of the substrates, i.e., the substrate 36a, and electrodes 37b are formed on the inside surface of the other substrate 36b. In the embodiment shown in FIG. 6, the electrodes 37a and 37b are formed in the form of stripes; however, they may be formed in other patterns, such as characters, numerals, and pictures. The electrodes 37a and 37b are formed of an optical transparent material, such as ITO (indium tin oxide).

Figure 7:
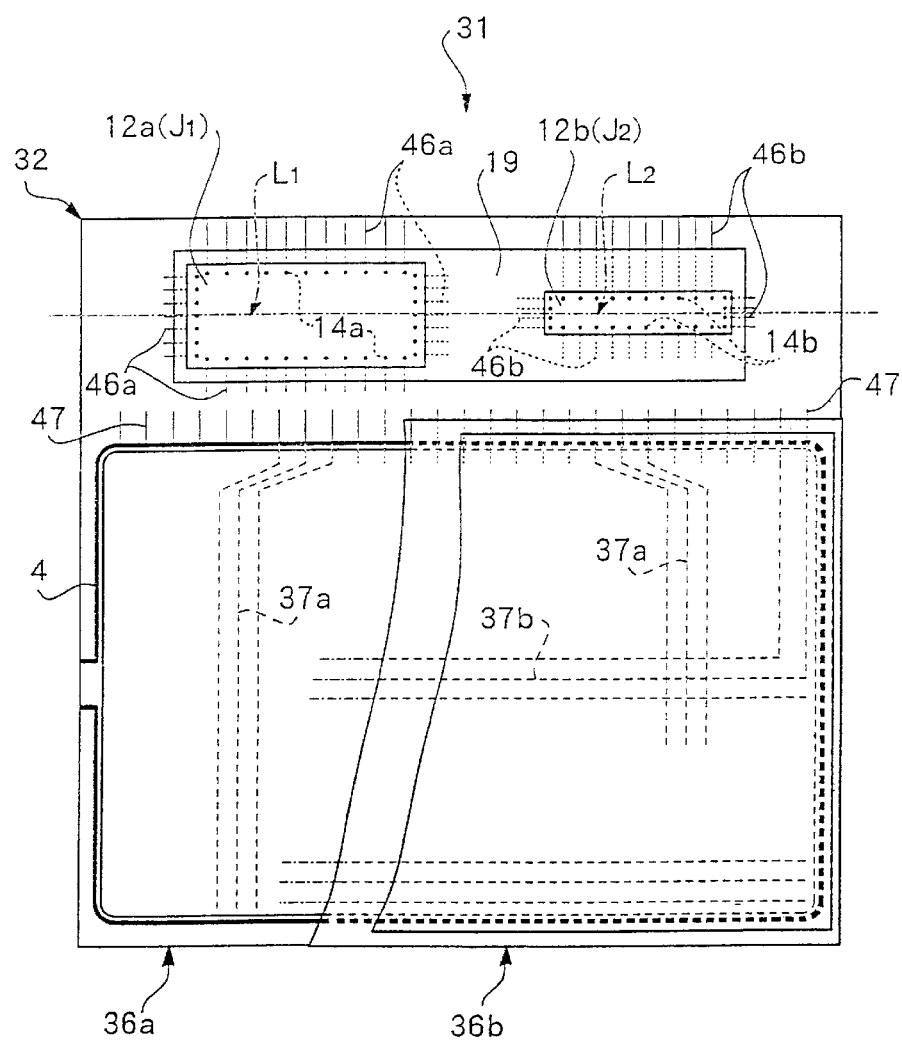
FIG. 7 is a plan view of the partly exploded liquid crystal device in FIG. 6.

The substrate 36a has a protruding portion which protrudes under the other substrate 36b, and substrate-side terminals 46a, substrate-side terminals 46b, and electrode extending portions 47 extending from the electrodes 37a and 37b are formed on the protruding portion, as shown in FIG. 7. The substrate-side terminals 46a, the substrate-side terminals 46b, and the electrode extending portions 47 are simultaneously formed when the electrodes 37a are formed on the substrate 36a, and hence, these are formed of, for example, ITO.

The electrode extending portions 47 include terminals integrally extending from the electrodes 37a and, for example, terminals extending from the electrodes 37b via conductive materials (not shown) dispersed in the sealing material 4. The substrate-side terminals 46a, the substrate-side terminals 46b, and the electrode extending portions 47 are connected to each other by an appropriate wiring pattern; however, since the appropriate pattern can be achieved by various kinds of patterns, the pattern is omitted in FIG. 7.

Actually, the electrodes 37a and 37b, and the electrode extending portions 47 are respectively composed of a number of electrodes and terminals, which are formed with extremely minute spaces therebetween on the substrates 36a and 36b; however, for ease of illustration in FIG. 7, the respective spaces are enlarged and schematically drawn, and in addition, several electrodes 37a and 37b, and the electrode extending portions 47 are representatively shown in the figure, and others are omitted. Spaces between terminals of the substrate-side terminals 46a and 46b are also enlarged and schematically drawn.

Front ends of the substrate-side terminal 46a and the substrate-side terminal 46b extend, respectively, into an IC mounting area J1 for mounting the liquid crystal driver IC 12a and an IC mounting area J2 for mounting the liquid crystal driver IC 12b. The liquid crystal driver IC 12a, as shown in FIG. 3, has a plurality of bumps 14a as IC-side terminals on an active surface 13a of the liquid crystal driver IC 12a. In addition, the liquid crystal driver IC 12b, as shown in FIG. 4, has a plurality of bumps 14b as IC-side terminals on an active surface 13b of the liquid crystal driver IC 12b.

When the liquid crystal driver IC 12a and the liquid crystal driver IC 12b are mounted on the protruding portion of the liquid crystal substrate 36a, as shown in FIG. 6, an ACF (anisotropic conductive film) 19 as a bonding agent is glued on the surface of the protruding portion of the liquid crystal substrate 36a so as to cover the IC mounting areas J1 and J2. Next, the liquid crystal driver ICs 12a and 12b are temporarily disposed on the protruding portion of the liquid crystal substrate 36a so that the bumps 14a and 14b of the liquid crystal driver ICs 12a and 12b are placed at positions corresponding to those of substrate-side terminals 46a and the substrate-side terminals 46b, respectively.

Then, as shown in FIG. 5(a), the part of the liquid crystal substrate 36a on which the liquid crystal driver IC 12a is temporarily disposed is transported by the transporting apparatus under the compressive head 21 which is heated to a predetermined temperature, and the liquid crystal driver IC 12a and the ACF 19 are heated and compressed by moving the compressive head 21 in the direction indicated by the arrow A. By this heating and compression, a resin 22 of the ACF 19 is cured, and the liquid crystal driver IC 12a is tightly bonded to the liquid crystal substrate 36a. Furthermore, the bumps 14a and the substrate-side terminals 46a are conductively connected to each other via conductive particles 23 in the ACF 19.

Upon completion of the compression bonding on the liquid crystal driver IC 12a as described above, the transporting apparatus for the liquid crystal panel 32 restarts, and, as shown in FIG. 5(b), the part of the liquid crystal substrate 36a on which the liquid crystal driver IC 12b is temporarily disposed is transported by the transporting apparatus under the compressive head 21, and the liquid crystal driver IC 12b and the ACF 19 are heated and compressed by moving the compressive head 21 in the direction indicated by the arrow A. By this heating and compression, the resin 22 of the ACF 19 is cured, and the liquid crystal driver IC 12b is tightly bonded to the liquid crystal substrate 36a. Furthermore, the bumps 14b and the substrate-side terminals 46b are conductively connected to each other via the conductive particles 23 in the ACF 19.

By the compression bonding as described above, as shown in the view of plan in FIG. 7, the liquid crystal driver IC 12a and the liquid crystal driver IC 12b are mounted in predetermined areas on the protruding portion of the liquid crystal substrate 36a, i.e., in the IC mounting areas J1 and J2, respectively.

In the embodiment, as shown in FIG. 3, the plurality of bumps 14a provided on the liquid crystal driver IC 12a are disposed so as to form a pair of terminal lines R1 and R2 opposing each other. In addition, as shown in FIG. 4, the plurality of bumps 14b provided on the liquid crystal driver IC 12b are disposed so as to form a pair of terminal lines R3 and R4 opposing each other.

In the embodiment, in the state in which the liquid crystal driver IC 12a and the liquid crystal driver IC 12b are mounted on the protruding portion of the liquid crystal substrate 36a, the central line L1 (refer to FIG. 3) between the terminal lines R1 and R2 on the liquid crystal driver IC 12a and the central line L2 (refer to FIG. 4) between the terminal lines R3 and R4 on the liquid crystal driver IC 12b are disposed so as to approximately coincide with each other, that is, the substrate-side terminals 46a and 46b are wired in a predetermined pattern so that the central lines L1 and L2 are approximately disposed on a straight line.

In the case in which mounting positions for the liquid crystal driver ICs 12a and 12b are defined as described above, when the liquid crystal panel 32 on which the liquid crystal driver ICs 12a and 12b are temporarily disposed is simply and linearly transported in the direction parallel to the central lines L1 and L2 between the bumps of the individual liquid crystal driver ICs, and when the compressive head 21 is disposed at a predetermined position, the liquid crystal driver ICs 12a and 12b are precisely transported under the compressive head 21. That is, compression bonding can be precisely performed for a plurality of liquid crystal driver ICs without complicated movement of the compressive head 21.

In the embodiment, since the central lines L1 and L2 of the liquid crystal driver ICs 12a and 12b, respectively, are approximately disposed on a straight line, it is sufficient that only a piece of the ACF 19 for bonding the liquid crystal driver ICs 12a and 12b be glued along the central lines L1 and L2. When the positions of the central lines Li and L2 between the bumps of the liquid crystal driver ICs 12a and 12b, respectively, are deviated from each other, an operation for gluing the ACF on the substrate becomes complicated since a plurality of ACFs are required for individual liquid crystal driver ICs; however, in the embodiment, the complicated operation can be avoided.

In the embodiment, in the liquid crystal driver ICs 12a and 12b, the external width of the IC chip at a surface on which the terminal lines R1 and R2 are formed may be different from or may be equivalent to that of the IC chip at a surface on which the terminal lines R3 and R4 are formed.

Figure 8:
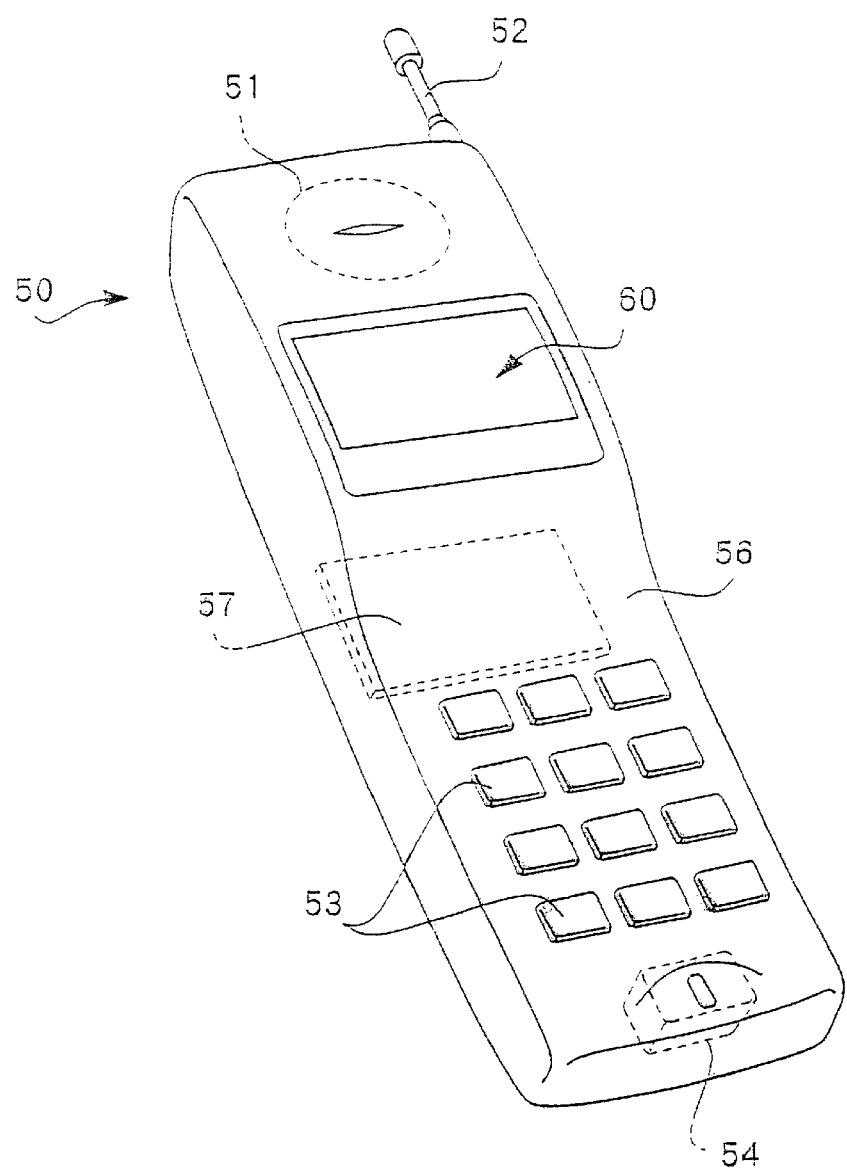
FIG. 8 is a perspective view showing an embodiment of an electronic apparatus of the present invention.

FIG. 8 shows a mobile phone of an embodiment of the electronic apparatus of the present invention. A mobile phone 50 shown in the figure has a structure in which components, such as an antenna 52, a speaker 51, a liquid crystal apparatus 60, key switches 53, and a microphone 54 are received in an exterior case 56 as a housing. In the interior of the exterior case 56, a control circuit board 57 having control circuits thereon for controlling operation of the components mentioned above is provided. The liquid crystal apparatus 60 may be constructed by the liquid crystal device shown in FIG. 1 or 6.

In the mobile phone 50, signals inputted through the key switches 53 and the microphone 54, data received by the antenna 52, and the like are inputted to the control circuits on the control circuit board 57. Then, the control circuits display images, such as numerals, characters, and pictures, on the display screen of the liquid crystal apparatus 60 in accordance with various data inputted. In addition, transmission data are transmitted through the antenna 52.

Hereinbefore, the present invention has been described with reference to preferred embodiments: however the present invention is not limited thereto and may be variably modified within the scope described in claims.

For example, in the embodiments shown in FIGS. 1 and 6, two liquid crystal driver ICs are mounted; however, it is apparent that the present invention can be applied to the case in which three or more liquid crystal driver ICs are mounted.

In the embodiment in FIG. 2, in the liquid crystal driver ICs 12a and 12b, the central lines L1 and L2 between the terminal lines approximately coincident with external central lines of the ICs at sides on which the terminals lines are formed, respectively, are described by way of an example. However, among various kinds of liquid crystal driver ICs, there is a liquid crystal driver IC having a structure in which bumps 14a are formed deviating from the center of a liquid crystal driver IC 12c, as shown in FIG. 9, and hence, the central line L1 between the terminal lines deviates from the external central line L0 of the liquid crystal driver IC 12c.

Figure 9:
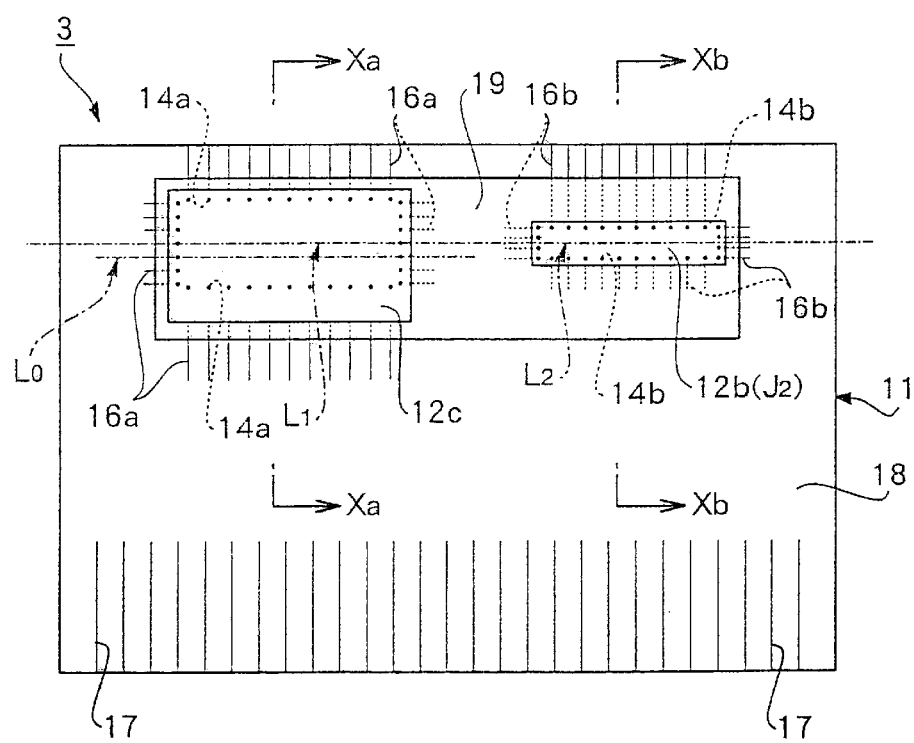
FIG. 9 is a plan view of a multichip mounted structure of another embodiment.
Figure 10:
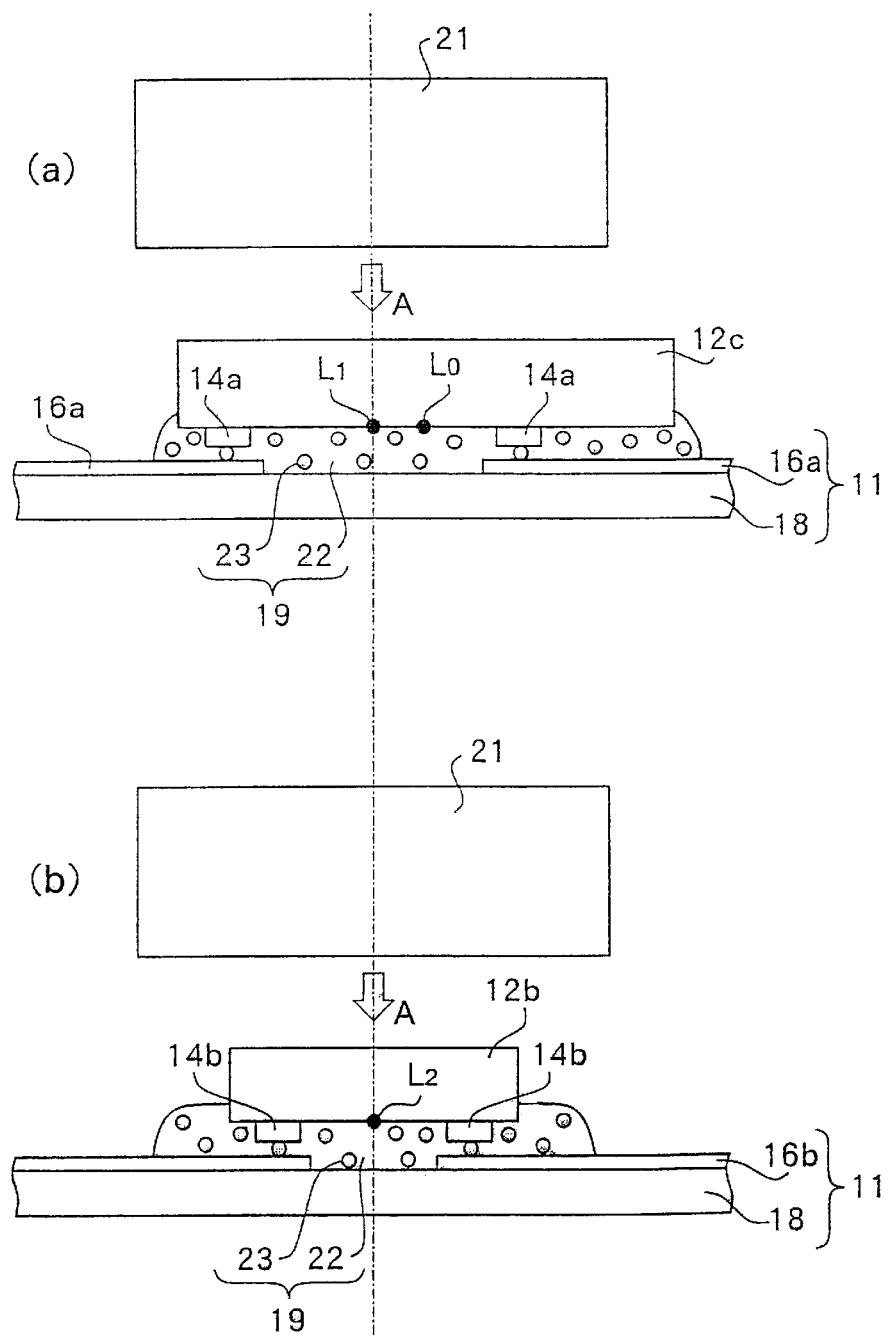
FIGS. 10(a) and (b) schematically show a compression bonding operation.

In the case in which the liquid crystal driver IC 12c described above is used, when the liquid crystal driver ICs 12c and 12b are mounted, as shown in FIGS. 9 and 10, the external central line L0 of the liquid crystal driver IC 12c is not coincident with the central line L2 between the terminal lines of the other liquid crystal driver IC 12b, and the central line L1 between the terminal lines of the liquid crystal driver IC 12c is approximately coincident with the central line L2 between the terminal lines of the liquid crystal driver IC 12b.

According to the constructions described above, concerning the liquid crystal driver IC 12c, approximately uniform compressive force by a compressive head 21 (FIG. 10) is applied onto all bumps 14a, and as a result, connection reliability of the conductive connection between the bumps 14a and substrate-side terminals 16a can be maintained at a higher level.

In addition, the embodiment of the present invention is described using the liquid crystal device as an example of electro-optical devices; however, the present invention may be applied to electro-optical devices other than the liquid crystal device. For example, the present invention may be applied to, for example, an electroluminescence (EL) device using a light-emitting polymer, a plasma display device (PDP), and a field emission display.

As described above, according to the multichip mounted structure, the electro-optical device, and the electronic apparatus of the present invention, a plurality of IC chips are mounted so that the central lines between the terminal lines of the individual IC chips coincide with each other. Consequently, when a manufacturing tool, such as a compressive head, is disposed at a predetermined position, an object including the IC chips to be processed is linearly transported to the position of the tool and then the object is processed by the tool, it is not necessary to transport the manufacturing tool between the plurality of IC chips.

In addition, when the plurality of IC chips are mounted so that the central lines between the terminal lines of the IC chips approximately coincide with each other, a bonding agent, such as an ACF, can be simply provided linearly along the plurality of IC chips.

As a result, according to the present invention, a plurality of IC chips can be effectively mounted on a substrate with high productivity and by a smaller number of manufacturing devices.

What is claimed is:

1. A multichip mounted structure comprising:
a substrate provided with substrate-side terminals; and
a plurality of integrated circuit chips mounted on the substrate, each integrated circuit chip having integrated-circuit-side terminals, in which the substrate-side terminals and the integrated-circuit-side terminals are in conductive connection with each other;
wherein the integrated-circuit-side terminals form a pair of terminal lines opposing each other, and the plurality of integrated circuit chips are mounted on the substrate so that individual central lines between the pairs of terminal lines approximately coincide with each other.

2. A multichip mounted structure according to claim 1, wherein an external width of a surface provided with the pair of terminal lines of at least one of the plurality of integrated circuit chips differs from those of the other integrated circuit chips.

3. A multichip mounted structure according to claim 1, wherein the central line between the pair of terminal lines of at least one of the plurality of integrated circuit chips deviates from the external central line of a surface thereof provided with the pair of terminal lines.

4. A multichip mounted structure according to claim 1, wherein the substrate is formed by a resinous material having flexibility.

5. A multichip mounted structure according to claim 1, wherein the substrate is formed by a material having no flexibility.

6. An electro-optical device comprising:
a pair of substrates opposing each other;
an electro-optical material being encapsulated between the pair of substrates; and
a multichip mounted structure in contact with at least one of the pair of substrates;
wherein the multichip mounted structure includes:
a single base layer substrate provided with substrate-side terminals; and
a plurality of integrated circuit chips mounted on the single base layer substrate, each integrated circuit chip having integrated-circuit-side terminals, in which the substrate-side terminals and the integrated-circuit-side terminals are in conductive connection with each other;
wherein the integrated-circuit-side terminals form a pair of terminal lines opposing each other, and the plurality of integrated circuit chips are mounted on the single base layer substrate so that individual central lines between the pairs of terminal lines approximately coincide with each other.

7. An electro-optical device according to claim 6, wherein liquid crystal is used as the electro-optical material.

8. An electro-optical device comprising:
a pair of substrates opposing each other, in which at least one of the substrates is provided with substrate-side terminals;
an electro-optical material being encapsulated between the pair of substrates; and
a plurality of integrated circuit chips, each integrated circuit chip having integrated-circuit-side terminals, in which the plurality of integrated circuit chips are mounted on a surface of at least one of the substrates so that the substrate-side terminals and the integrated-circuit-side terminals are in conductive connection with each other so as to form a multichip mounted structure;
wherein the integrated-circuit-side terminals form a pair of terminal lines opposing each other, and individual central lines between the pairs of terminal lines approximately coincide with each other.

9. An electro-optical device according to claim 8, wherein liquid crystal is used as the electro-optical material.

10. An electronic apparatus comprising:

an electro-optical device; and a housing containing the electro-optical device therein;

wherein the electro-optical device is composed of an electro-optical device according to claim 6.

11. A multichip structure comprising:

a substrate;

substrate terminals formed on said substrate;

a first integrated circuit chip;

first chip terminals formed on said first integrated circuit chip in a pair of first chip terminal lines which define a first chip terminal center line therebetween;

a second integrated circuit chip; and second chip terminals formed on said second integrated circuit chip in a pair of second terminal lines which define a second chip terminal center line therebetween;

wherein said first and second integrated circuit chips are mounted to said substrate such that said first chip terminal center line and said second chip terminal center line are approximately collinearly aligned and said first and second chip terminals are conductively connected to said substrate terminals.

12. The multichip structure of claim 11 wherein said first integrated circuit chip is wider than said second integrated circuit chip.

13. The multichip structure of claim 11 wherein said first chip terminal center line is offset from a center line of said first integrated circuit chip.

14. The multichip structure of claim 11 wherein said substrate further comprises a substantially flexible material.

15. The multichip structure of claim 11 wherein said substrate further comprises a substantially rigid material.

16. The multichip structure of claim 11 further comprising a second substrate disposed opposite said substrate and an electro-optical material disposed therebetween.

17. The multichip structure of claim 16 wherein said electro-optical material further comprises liquid crystal.

18. A method of forming a multichip structure comprising:

providing a substrate;

forming substrate terminals on said substrate;

providing a first integrated circuit chip;

forming first chip terminals on said first integrated circuit chip in a pair of first chip terminal lines which define a first chip terminal center line therebetween;

providing a second integrated circuit chip;

forming second chip terminals on said second integrated circuit chip in a pair of second terminal lines which define a second chip terminal center line therebetween; and mounting said first and second integrated circuit chips onto said substrate such that said first chip terminal center line and said second chip terminal center line are approximately collinearly aligned and said first and second chip terminals are conductively connected to said substrate terminals.

19. The method of claim 18 wherein said mounting step further comprises:

temporarily positioning said first and second integrated circuit chips on said substrate such that they are approximately colinearly aligned;

moving said substrate relative to a pressing head; and pressing said first and second integrated circuit chips against said substrate.

20. The method of claim 19 further comprising disposing a strip of a bonding agent along said substrate terminals of said substrate prior to positioning said first and second integrated circuit chips thereon, said strip being positioned so as to correspond to said collinear alignment of said first and second chip terminal center lines.

21. An electro-optical device comprising:

an electro-optical material;

a substrate supporting the electro-optical material;

a first integrated circuit chip wherein the first integrated circuit chip includes a plurality of first chip terminals, and wherein the terminals are arranged in a pair of first chip terminal lines which define a first chip terminal center line therebetween; and a second integrated circuit chip, wherein the second integrated circuit chip includes a plurality of second chip terminals, and wherein the terminals are arranged in a pair of second chip terminal lines which define a second chip terminal center line therebetween, wherein the first and second integrated circuit chips are mounted to the substrate such that the first chip terminal center line and the second chip terminal center line are approximately collinearly aligned, and wherein widths of the first and second integrated circuit chips are different from each other.

22. An electro-optical device comprising:

an electro-optical material;

a substrate supporting the electro-optical material;

a first integrated circuit chip, wherein the first integrated circuit chip includes a plurality of first chip terminals, and wherein the terminals are arranged in a pair of first chip terminal lines which define a first chip terminal center line therebetween; and a second integrated circuit chip, wherein the second integrated circuit chip includes a plurality of second chip terminals, and wherein the terminals are arranged in a pair of second chip terminal lines which define a second chip terminal center line therebetween, wherein the first and second integrated circuit chips are mounted to the substrate such that the first chip terminal center line and the second chip terminal center line are approximately collinearly aligned, and wherein a width between the pair of first chip terminal lines is different from a width between the pair of second chip terminal lines.

* * * * *